(12) United States Patent
Kasper (10) Patent No.: US 10,890,642 B1
(45) Date of Patent: Jan. 12, 2021

(54) CALIBRATING IMPEDANCE MEASUREMENT DEVICE

(71) Applicant: Keysight Technologies, Inc., Santa Rosa, CA (US)

(72) Inventor: Manuel Kasper, Traun (AT)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/527,960

(22) Filed: Jul. 31, 2019

(51) Int. Cl.
  *G01R 35/00* (2006.01)
  *G01R 27/02* (2006.01)

(52) U.S. Cl.
  CPC .......... *G01R 35/005* (2013.01); *G01R 27/02* (2013.01)

(58) Field of Classification Search
  CPC ........ G01R 27/02; G01R 27/32; G01R 35/00; G01R 24/005; G01R 35/007; G01N 27/416; G01N 27/3274
  See application file for complete search history.

(56) References Cited

U.S. PATENT DOCUMENTS

| | | | |
|---|---|---|---|
| 5,578,932 A * | 11/1996 | Adamian | G01R 35/005 324/601 |
| 5,666,059 A | 9/1997 | Heuermann et al. | |
| 6,643,597 B1 * | 11/2003 | Dunsmore | G01R 27/28 702/104 |
| 2011/0178752 A1 | 7/2011 | Hayden | |
| 2016/0209488 A1 * | 7/2016 | Zietz | G01R 35/005 |
| 2017/0254871 A1 * | 9/2017 | Sestok, IV | G01R 27/14 |

OTHER PUBLICATIONS

Keysight Technologies, "Impedance Measurement Handbook, A guide to measurement technology and techniques," 5th Edition—Application Note, Nov. 2, 2016, pp. 1-83.

* cited by examiner

*Primary Examiner* — Thang X Le (57) ABSTRACT

A method of calibrating an impedance measurement device for measuring DUT impedance includes performing short calibration measurements using a short calibration standard to obtain short raw data; performing first shunt calibration measurements using a first shunt calibration standard to obtain first raw data, the first shunt calibration standard having known first resistance and unknown first inductance; performing second shunt calibration measurements using a second shunt calibration standard to obtain second raw data, the second shunt calibration standard having known second resistance and unknown second inductance; determining first and second complex impedances of the first and second shunt calibration standards by calculating the first and second inductances using the short, first and second raw data applied to a specific error model; and determining general error coefficients for an error model using the first and second complex impedances and the first and second raw data applied to a one-port calibration procedure.

17 Claims, 5 Drawing Sheets

CALIBRATING IMPEDANCE MEASUREMENT DEVICE

BACKGROUND

Impedance spectroscopy is a powerful method for testing and analysis of many kinds of electrical devices, including batteries and supercapacitors, for example. In general, impedance measurements are disturbed by systematic errors, such as amplitude and phase tracking, stray inductance, stray capacitance, and unwanted crosstalk. Therefore, impedance spectroscopy instruments need to be properly calibrated in order to produce meaningful data.

Reliable calibration becomes increasingly difficult as impedance magnitude decreases and frequency increases. Conventional impedance measurement devices rely on factory pre-calibration and typically some form of short-compensation before beginning measurements on a device under test (DUT). Such calibration generally works well at standard impedances (e.g., 100 mΩ) and signal frequencies (e.g., 1 kHz). However, the situation is different at low impedances (e.g., 100μΩ) and high signal frequencies (e.g., 10 kHz), as is the case, for example, when testing modern high-power Lithium-Ion cells. In addition, the industry is pushing these testing limits with respect to very low impedances (e.g., 10μΩ) and very high signal frequencies (e.g., 100 kHz).

Currently, factory pre-calibration is corrupted by necessary fixturing (e.g., cables and/or force and sense wiring between the impedance measurement device and the DUT). Also, existing calibration methods are not using any calibration standard other than a short standard because there are no fully characterized impedance standards available. For example, low value resistors (e.g., 1 mΩ) are specified for resistance, but not for inductance. Therefore, full, absolute and traceable impedance calibration is not possible, and only a relative response calibration can be done. While this may be sufficient to compare measurements performed by one impedance measurement device, such calibration methods fail when measurements by different impedance measurement devices are compared to one another or when traceable absolute results are required. Accordingly, calibration devices and procedures are needed for providing reliable calibrations, even at very low impedances and very high frequencies, when calibration standards are not available.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element is said to be connected to a second element, this encompasses cases where one or more intermediate elements may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if an apparatus (e.g., a signal measurement device) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

Generally, according to various embodiments, full impedance calibration of an impedance measurement device, such as a network analyzer, impedance analyzer, LCR-meter or other spectroscopy instrument, may be performed without fully characterized calibration standards. In other words, calibration may be performed use low value resistors, as well as short standards, where only the real parts (resistance) of the low value resistors are specified. Accordingly, full impedance calibration may be performed directly at the DUT connectors in the impedance domain.

According to various embodiments, simple and reliable calibration of impedance measurement devices is performed. The calibration procedure is fast and may be used not only in research and development, but also in a production environment (e.g., battery cell production testing). The accuracy of the calibration procedure depends only on partly known shunt calibration standards (resistors), where the real part (resistance value) is known and the imaginary part (inductance value) is unknown. This enables efficient prediction of the uncertainty of ensuing impedance measurements, and produces reliable and repeatable results, even using relatively inexpensive calibration standards. In various embodiments, the calibration standards may be integrated into the impedance measurement device, and a multiplexer may be used to automatically select the integrated calibration standards. It is also possible to measure the resistance of the calibration standards at DC, and take the frequency behavior with proper EM modelling into account.

It is also possible to determine the frequency dependent real part of a shunt resistor (shunt calibration standard) by comparing the frequency dependent real part against a known frequency dependent function. For example, the shunt resistor may be measured by an impedance measurement device, described below. Subsequently, for example, a first short standard and a second short standard are measured with the first and second short standards having different properties, such as different current path lengths or different magnetic couplings between force and sense wiring, for example. The short standard measurements may be used to construct a signal of known frequency response, for example, by subtracting to provide a difference signal. The constructed signal may have a fixed phase angle and linearly increasing amplitude over frequency. Also, the constructed signal may be used to determine the transfer function TF of the impedance measurement equipment, for example, as follows:

$$|TF| = \frac{\text{Im}(differencesignal)}{\omega} * c,$$

where |TF| is the magnitude (absolute value) of the transfer function, Im(differencesignal) is the imaginary part of the difference signal, $\omega$ is the angular frequency, and c is a constant. The frequency dependent real part of the shunt resistor may be determined by taking the real part of the measured raw impedance of the frequency dependent resistor and divide or multiply it by the determined transfer function TF. The remaining constant c may be determined by a resistance measurement at low frequencies in the range of about 1 mHz to about 1 kHz, or at direct current (DC). This would lead to a completely automatic self-calibration.

Figure 1:
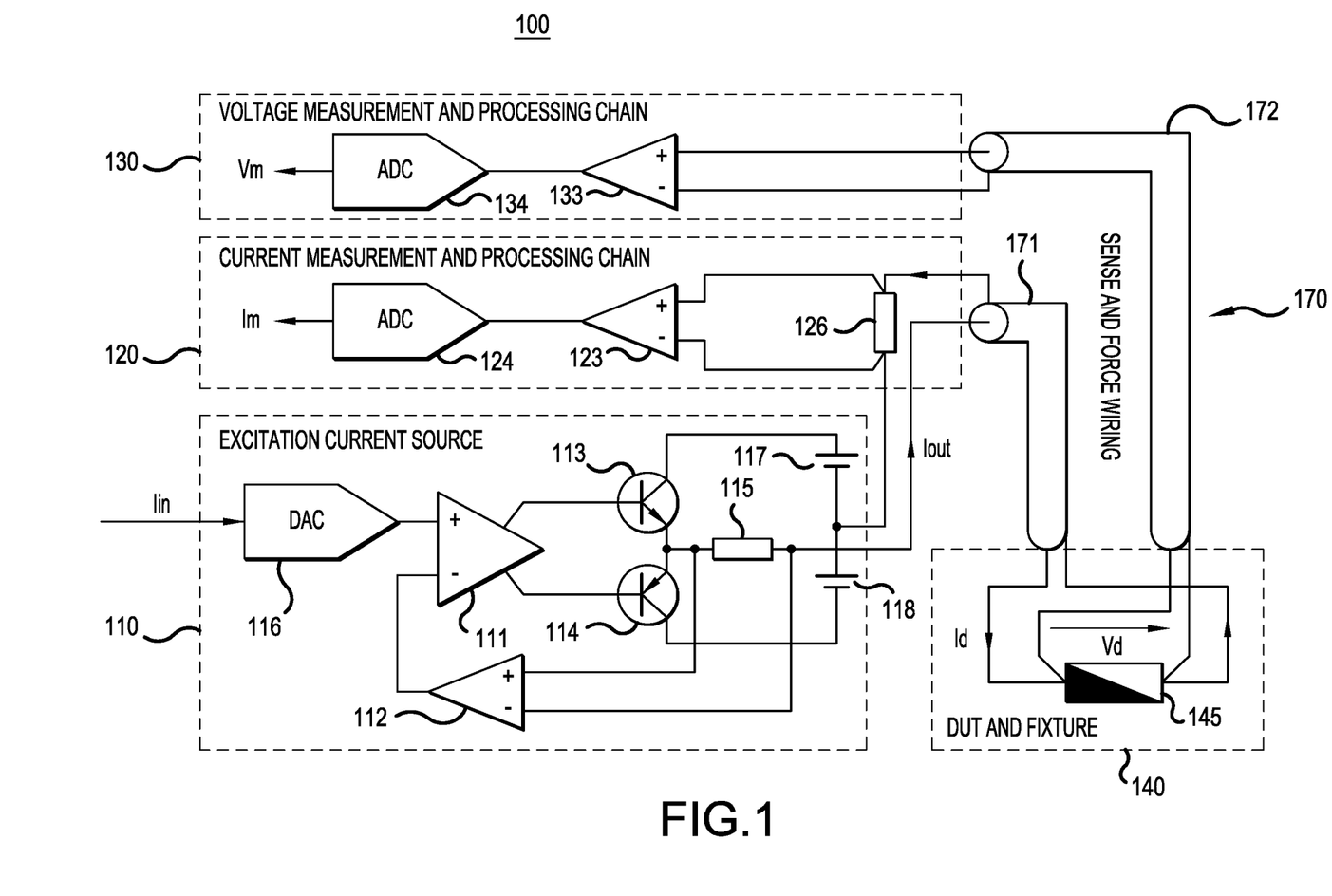
FIG. 1 is a simplified block diagram of a test instrument for measuring impedance of a device under test (DUT), according to a representative embodiment.

FIG. 1 is a simplified block diagram of an impedance measurement device for measuring impedance of a DUT, according to a representative embodiment. The calibration procedure calibrates the low level impedance measurements in a range from about 1 micro-Ohms up to about 100 Ohms at frequencies ranging from 1 micro-Hertz up to about 1 MHz, for example. In general, the embodiments work for various types of test instruments for measuring impedance, including implementation of the I-V method, auto-nulling bridge, two-wire connection, or four-wire connection, and current- or voltage-source excitation, for example. Current source excitation is also known as galvanostatic measurement, and voltage source excitation is also known as potentiostatic measurement.

Referring to FIG. 1, an impedance measurement device 100 is shown connected to DUT 140 by force and sense wiring (or test fixture) 170 for measuring impedance of the DUT 140. The impedance measurement device 100 includes an excitation current source 110, a current measurement circuit 120, and a voltage measurement circuit 130. The impedance measurement device 100 may be, for example, a network analyzer, a spectrum analyzer, an impedance analyzer, an oscilloscope combined with a signal generator, a general purpose digitizer combined with a generator, a lock-in amplifier combined with a generator or other impedance spectroscopy instrument built or specialized hardware that may contain analog to digital converters (ADCs), digital to analog converters (DACs), operational amplifiers or digital signal processing (DSP) or field programmable gate array (FPGA) technology.

The impedance measurement device 100 may further include a processing unit 180, connected (by wire or wirelessly) to each of the excitation current source 110, the current measurement circuit 120, and the voltage measurement circuit 130, for controlling various operations and performing measurements. The processing unit may include one or more computer processors, DSPs, FPGAs, application specific integrated circuits (ASICs), or combinations thereof, using any combination of hardware, software, firmware, hard-wired logic circuits, or combinations thereof. The processing unit 180 may include its own processing memory (e.g., volatile and/or nonvolatile memory) for storing computer readable code that enables performance of the various functions described herein. For example, the processing memory may store software instructions/computer readable code executable by the processing unit (e.g., computer processor) for performing some or all aspects of functions and methods described herein, including various steps of the method described below with reference to FIG. 3. Memories described herein may be implemented by any number, type and combination of random access memory (RAM) and read-only memory (ROM), for example, and may store various types of information, such as computer programs and software algorithms executable by the MIMO target emulator 130, discussed below, as well as data for antenna patterns/spacing of the DUT 101 and drive scenarios, for example. The various types of ROM and RAM may include any number, type and combination of computer readable storage media, such as a disk drive, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art, which are tangible and non-transitory storage media (e.g., as compared to transitory propagating signals).

The excitation current source 110 provides an output current $I_{out}$ (excitation signal) to the DUT 140 through a first connection cable 171 (e.g., coaxial cable) of the force and sense wiring 170 in response to an input signal $I_{in}$ (indicated as a current signal, for purposes of illustration). The DUT 140 includes DUT impedance 145 connected to the first connection cable 171 and a second connection cable 172 (e.g., coaxial cable) of the force and sense wiring 170. The current measurement circuit 120 is also connected to the DUT 140 by the first connection cable 171, and is configured to enable measurement of DUT current $I_d$ through the DUT impedance 145. The voltage measurement circuit 130 is connected to the DUT 140 through the second connection cable 172, and is configured to enable measurement of DUT voltage $V_d$ across the DUT impedance 145.

More particularly, the excitation current source 110 includes a first amplifier 111 with a non-inverting input connected to digital-to-analog converter (DAC) 116 for receiving the input signal $I_{in}$ and an inverting input connected to a feedback loop for ensuring that the output signal $I_{out}$ (excitation signal) of the excitation current source 110 follows exactly the input signal $I_{in}$ from the DAC 116. The input signal $I_{in}$ may be a frequency swept sinusoidal signal, for example, although other types of waveforms, such band-limited noise, multi-sinewave signals, or pseudo random bit sequence (PRBS) signals may be incorporated as well. The first amplifier 111 may be a linear bipolar type amplifier, for example, although other technologies, such as switching converters and interleaved switching converters, may be incorporated without departing from the scope of the present teachings. The excitation current source 110 further includes first and second transistors 113 and 114 connected to the output of the first amplifier 111, and resistor 115 connected between sources of the first and second transistors 113 and 114 at one end and connected to the first connection cable 171 at the other end. Voltage across the resistor 115 is input to a second amplifier 112 (feedback amplifier), the output of which is provided to the inverting input of the first amplifier 111 to provide the feedback loop, discussed above. The excitation current source 110 further includes first and second voltage sources 117 and 118 connected between drains of the first and second transistors 113 and 114. The voltage sources 117 and 118 may be fed by the electric grid, for example, or by any other electric power source.

The current measurement circuit 120 includes shunt resistor 126 connected between the first and second capacitors 117 and 118 at one end and connected to the first connection cable 171 at the other end. The current measurement circuit 120 also includes a third amplifier 123 and an analog-to-digital converter (ADC) 124. Voltage across the shunt resistor 122 is input to the third amplifier 123, and the output of the third amplifier 123 is digitized by the ADC 124 for measuring the DUT current $I_d$ through the DUT impedance 145 in the DUT 140. The digitized current vs. time signal is processed by digital signal processing techniques such as filtering, fast Fourier transform (FFT), Hilbert transform or correlation analysis, which may be executed by the processing unit 180, for example, resulting in measured current $I_m$.

The voltage measurement circuit 130 includes a fourth amplifier 133 and an ADC 134. Voltage from the second connection cable 172 is input to the fourth amplifier 133, and the output of the fourth amplifier 133 is digitized by the ADC 134 for measuring the DUT voltage $V_d$ across the DUT impedance 145 in the DUT 140. The digitized voltage is used by the processing unit 180 to calculate voltage vectors in the complex plane, resulting in measured voltage $V_m$. The complex measured current $I_m$ and the complex measured voltage $V_m$ may be used to determine measured impedance $Z_m$ of the DUT 140, defined as $V_m/I_m$. The true impedance $Z_d$ of the DUT 140 is defined as $V_d/I_d$, which is the calibrated result.

FIG. 1 provides an overview of systematic errors that occur in the impedance measurement device 100 when measuring low value impedances of the DUT 140. Such systematic errors may include gain-tracking between the current measurement circuit 120 and the voltage measurement circuit 130, phase and amplitude tracking between the current measurement circuit 120 and the voltage measurement circuit 130, force and sense wiring resistance/inductance, mutual inductance, and crosstalk between the current measurement circuit 120 and the voltage measurement circuit 130. Embodiments of the calibration procedure discussed herein correct for these systematic errors.

Generally, embodiments of the calibration procedure are structured into a calibration function and a correction function according to a specific error model. The calibration function takes the measured raw data of at least two partly known calibration standards (e.g., the real part is known and the imaginary part is unknown), determines model error coefficients according to a specific error model, and calculates complex impedances of the at least two partly known calibration standards using the model error coefficients and the measured raw data. Once the calibration standards are fully known from the specific error model, the correction function implements a standard one-port calibration procedure, e.g., based on ABCD matrices, to calculate general error coefficients of a generic one-port error model. The correction function then takes measured impedance $Z_m$ of the DUT 140 and the general error coefficients, and determines the true impedance $Z_d$ of the DUT 140, which is the final calibrated result.

Figure 2:
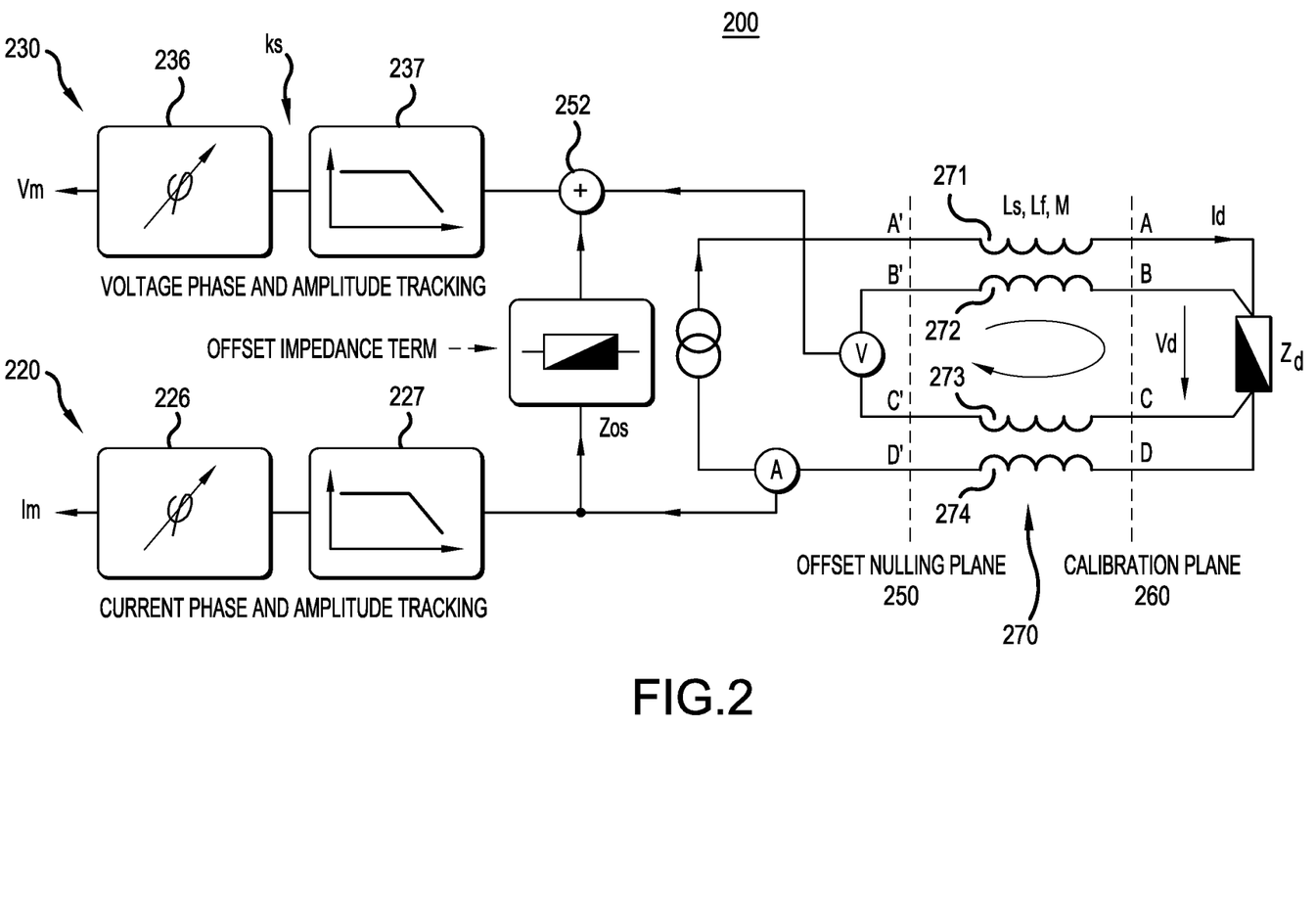
FIG. 2 is a simplified circuit diagram indicating the specific error model corresponding to the impedance measurement device of FIG. 1, according to a representative embodiment.

FIG. 2 is a simplified circuit diagram indicating the specific error model corresponding to the impedance measurement device 100 of FIG. 1, according to a representative embodiment.

Referring to FIG. 2, a specific error model 200 represents systematic error terms of the impedance measurement device, and provides model error coefficients indicative of the systematic error terms. The model error coefficients of the specific error model 200 include mutual inductance M, offset impedance Zos and complex scaling value ks, used to determine the imaginary part of each of the partly known calibration standards.

A DUT (e.g., DUT 140) is indicated by DUT impedance (or true impedance) $Z_d$, which is located at a calibration plane 260 of the specific error model 200 for measuring impedance of the DUT. The DUT impedance $Z_d$ is connected at an (arbitrarily placed) offset nulling plane 250 by force and sense wiring 270, which in the depicted embodiment provides a four-wire connection at connectors A, B, C and D in the calibration plane 260. The force and sense wiring 270 is indicated by first inductances 271 and 272 in force wiring, and second inductances 273 and 274 in sense wiring used for measuring the DUT current $I_d$ and DUT voltage $V_d$. The force and sense wiring 270 may include the connection cables (e.g., first and second connection cables 171 and 172). When the DUT impedance $Z_d$ or other impedance is connected at the calibration plane 260 during testing, magnetic coupling occurs between the first inductances 271 and 272, and between the second inductance 272 and the second inductance 274, represented by the mutual inductance M. An assumption is made that the only systematic error between the calibration plane 260 and the offset nulling plane 250 is due to the magnetic coupling. Accordingly, any error in the measured impedance $Z_m$ would be caused by voltage induced by the force current into the sense wiring. There should be no significant error in the real part of the measured impedance $Z_m$ (e.g., parallel conductance) due to the force and sense wiring 270, nor any change of the force current due to the sense voltage (e.g., stray capacitance). That is, the specific error model may neglect parasitic capacitances, and may assume pure inductive coupling between force and sense for the force and sense wiring connections. In practice, low impedance levels of the DUT impedance $Z_d$ ensure almost perfect fulfillment of the assumption that the only systematic error is due to magnetic coupling in the force and sense wiring 270 between the calibration plane 260 and the offset nulling plane 250. Without loss of generality, the short measurement at the offset nulling plane 250 may be replaced by an offset-short measurement (not shown) at the calibration plane 260 with the offset-short standard being a four-wire short standard of different current path length and different magnetic coupling between force and sense wiring 270, or between terminals of the offset-short standard, compared to the short standard. In this case the construction of the short and offset-short standard can guarantee the fulfillment of above assumptions. Construction details may include low loss design, preventing eddy currents, proximity effect and skin effect.

Within the impedance measurement device itself (located to the left of the offset nulling plane 250), the error model 200 includes a current measurement channel 220 corresponding to the current measurement circuit 120, and a voltage measurement channel 230 corresponding to the voltage measurement circuit 130 in FIG. 1. The current measurement channel 220 is indicated by a current phase tracking function 226 and a current amplitude tracking function 227, and outputs the measured current $I_m$. The voltage measurement channel 230 is indicated by a voltage phase tracking function 236 and a voltage amplitude tracking function 237, and outputs the measured voltage $V_m$. Arbitrary phase and amplitude responses, determined by the current and voltage phase tracking functions 226, 236 and the current and voltage amplitude tracking functions 227, 237, are used to determine the complex scaling value ks in the impedance domain. The complex offset impedance Zos is indicated between the current measurement channel 220 and the voltage measurement channel 230, connected at an adder 252.

As such, the impedance measurement device is modelled as a perfect vector ammeter and a perfect vector voltmeter. Systematic errors of the impedance measurement device are represented by model error coefficients including the complex offset impedance Zos, the complex scaling value ks, and the mutual inductance M. Cross-talk between the current measurement channel 220 the voltage measurement channel 230 may be removed.

Figure 3:
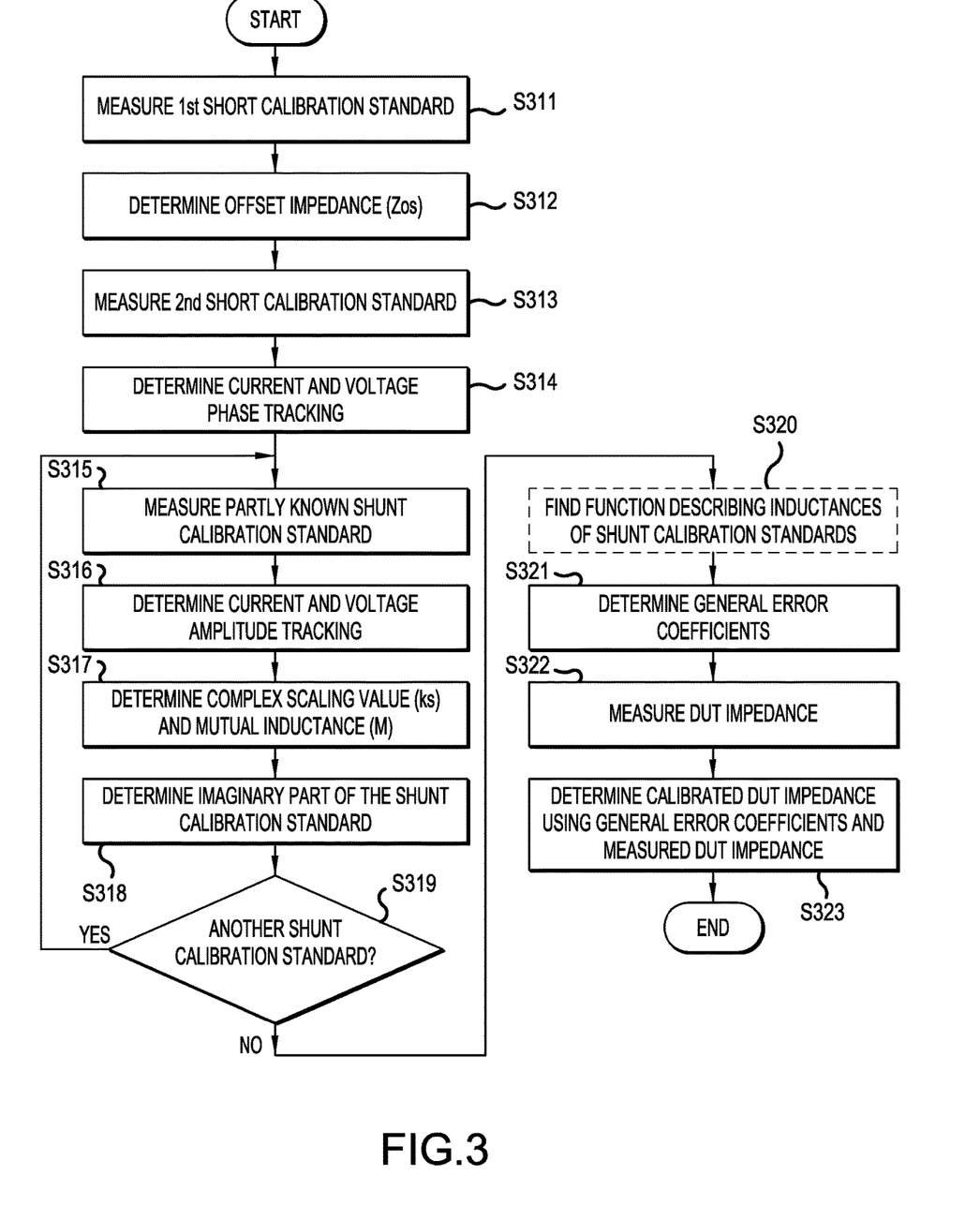
FIG. 3 is a simplified flow diagram for determining calibrated impedance of a DUT, according to a representative embodiment.

FIG. 3 is a simplified flow diagram for determining calibrated impedance of a DUT, according to a representative embodiment. The flow diagram includes first determining model error coefficients in a specific error model (e.g., specific error model 200) corresponding to the impedance measurement device before determining the calibrated (true) impedance of the DUT. The operations of FIG. 3 are controlled and/or implemented by one or more processing units or controllers, such as the processing unit 180, discussed above.

Referring to FIG. 3, impedance of a first (initial) short calibration standard is measured in block S311. In order to measure the first short calibration standard, the sense and force wiring 270 is disconnected and replaced by the first short calibration standard at the offset nulling plane 250 (although the precise position of the connection is not critical). In the depicted embodiment, the first short calibration standard includes a four-wire short connection for connecting to leads A', B', C' and D', respectively, on the impedance measurement device. In an alternative embodiment, the first short calibration standard may be measured with the force and sense wiring 270 kept in place, and with an offset-short calibration standard connected to the calibration plane 260. The offset-short calibration of a four-wire short connection for connecting to leads A, B, C, and D, respectively, with the short connection having a different current path length and a different magnetic coupling between the force and sense wiring 270 compared to a second short standard (e.g., discussed below with reference to block S313). With the first short calibration standard in place, offset impedance Zos of the specific error model 200 is initially determined in block S312 based on raw data from the first short calibration standard measurement, for example, according to the equation: $Zos=Zm_{short1}$, where $Zm_{short1}$ is the measured raw impedance of the first short calibration standard. More particularly, a measurement with desired sweep settings (e.g., initial predetermined frequency range and number of points) is triggered in block S311 in response to a test signal sweep over the initial predetermined frequency range, and the acquired raw data is used to compute the offset impedance Zos in block S312. The computation may be performed by the processing unit 180.

Blocks S311 and S312 depict initial steps, meaning that they do not need to be performed for every DUT measurement. Rather, blocks S311 and S312 may be performed occasionally, such as every one to twenty weeks, for example, or when significant hardware changes have been made to the impedance measurement device 100. The initial predetermined frequency range of the measurement should be broad enough to include all anticipated frequencies of upcoming DUT measurements to avoid extrapolation, although interpolation is acceptable to a certain degree.

Regular calibration measurements begin at block S313, in which impedance of a second short calibration standard is measured over a predetermined frequency range at the calibration plane 260 with the sense and force wiring 270 connected. The predetermined frequency range may be the same as or different from the initial predetermined frequency range used for the measurements in block S311. For example, since the type of DUT may be known for the regular calibration measurements, the predetermined frequency range may be narrower, as compared to the initial predetermined frequency range, in view of the specific characteristics of the DUT. The second short calibration standard includes a four-wire short connection, and is connected to leads A, B, C and D, respectively, on the force and sense wiring 270 in the calibration plane 260. By definition, the second short calibration standard has an impedance of 0+j0 Ohm. In block S314, phase tracking is determined in the impedance domain, according to the current and voltage phase tracking functions 226 and 236, using the raw data from the second short calibration standard measurement. The phase tracking ($\phi_{trackin}$) may be determined according to the equation: $\phi_{tracking}=\arg(Zm_{short2}-Zos)$, where $Zm_{short2}$ is the measured raw impedance of the second short calibration standard.

The second short calibration standard geometry match the DUT geometry, since deviations between the two (e.g., differences in contact distance) will cause systematic error in the DUT measurement. The raw data may also be used subsequently to provide the full one-port calibration, discussed below.

Blocks S315 to S319 form a loop in which multiple partly known shunt calibration standards are measured. At least two shunt calibration standards (first and second shunt calibration standards) must be measured in order to perform the one-port calibration to determine the general error coefficients in block S321, so the loop in FIG. 3 is performed at least twice. Each of the shunt calibration standards is a low value resistor having a partly known impedance, meaning that a real part of the impedance (resistance) is known and an imaginary part of the impedance (inductance) is not know. The resistors may be relatively inexpensive since there is no need to generate and provide inductance data with them. In various embodiments, more than two shunt calibration standards (first through Nth shunt calibration standards, where N is a positive integer) may be used to improve calibration by solving an overdetermined calibration problem, for example, using a least squared error method, as would apparent to one of ordinary skill in the art.

In block S315, impedance of a first shunt calibration standard is measured over the predetermined frequency range at the calibration plane 260 with the sense and force wiring 270 connected. The first shunt calibration standard includes a four-wire shunt for connecting to leads A, B, C and D, respectively, in the calibration plane 260. The raw data from the first shunt calibration standard measurement performed in block S315, along with the raw data from the second short calibration standard measurement performed in block S313, are used to determine additional model error coefficients of the specific error model 200. That is, in block S316, amplitude tracking ($A_{tracking}$) is determined in the impedance domain, according to the current and voltage amplitude tracking functions 227 and 237, based on the raw data from the first shunt calibration standard measurement and the equation:

$$A_{tracking} = \frac{\text{Re}(Zm_{shunt1} * e^{-j*\varphi_{tracking}})}{R_{shunts}},$$

where $Zm_{shunt1}$ is the measured raw impedance of the first shunt calibration standard and $R_{shunt1}$ the known resistance of the first shunt calibration standard. In block S317, the amplitude tracking from block S316 and the phase tracking from block S314 are used to determine the complex scaling value ks and the mutual inductance M according to equations $ks = A_{tracking} * e^{j*\varphi_{tracking}}$ and $M = j*\omega*ks^{-1}*(Zm_{short2} - Zos)$, where $\omega$ is the angular frequency. Using the complex scaling value ks and the mutual inductance M, the imaginary part of the first calibration shunt standard is determined in block S318 using, for example, the equation: $X_{shunt1} = ks^{-1} * (Zm_{shunt1} - Zos) - j*\omega*M$. Notably, the method works independently for each frequency of the input signal (e.g., input signal $I_{in}$).

In block S319 it is determined whether there is another shunt calibration standard on which to perform measurements. When there is another shunt calibration standard to measure (block S319: Yes), blocks S315 to S318 are repeated as a loop in order to determine the complex scaling value ks, the mutual inductance M, and the imaginary part of this calibration shunt standard. In an embodiment, each loop results in calculation of individual complex scaling values ks and mutual inductances M for each individual shunt imaginary part. In an alternative embodiment, the complex scaling value ks and the mutual inductance M from the first loop are reused in subsequent executions, and used to calculate the individual imaginary parts. In another alternative embodiment, the complex scaling values ks and the mutual inductances M are collected from each loop and process into a final combined (e.g., averaged) complex scaling value ks and mutual inductance M, which is used to calculate the individual imaginary parts.

For example, returning to block S315, impedance of a second shunt calibration standard is measured over the predetermined frequency at the calibration plane 260 with the sense and force wiring 270 connected. The second shunt calibration standard includes a four-wire shunt for connecting to leads A, B, C and D, respectively, in the calibration plane 260. The raw data from the second shunt calibration standard measurement performed in block S315, along with the raw data from the second short calibration standard measurement performed in block S313, are used to determine additional model error coefficients of the specific error model 200. In block S316, amplitude tracking is determined in the impedance domain, according to the current and voltage amplitude tracking functions 227 and 237, based on the raw data from the second shunt calibration standard measurement. In block S317, the amplitude tracking from block S316 and the phase tracking from block S314 are used to again determine the complex scaling value ks and the mutual inductance M. Using the complex scaling value ks and the mutual inductance M, the imaginary part of the second calibration shunt standard is determined in block S318.

When there are no other shunt calibration standards to be measured (block S319: No), the process proceeds to block S320. This block is optional (as indicated by the dashed line) and enables the method to extend below low frequencies (e.g., <10 Hz). In block S320, a function (or fit) is determined, for example, by polynomial fitting that describes the inductance vs. frequency of each of the shunt calibration standards. The data used to determine the function is limited to a certain frequency range that includes no frequencies below a certain value (e.g., 10 Hz). For the subsequent calibration steps, inductance data is then derived from the determined function, where the determined function extrapolates the data below the certain frequency value (e.g. 10 Hz). Optional block S320 may be used in cases of signal to noise ratio limitations of the impedance measurement equipment 100 below a certain frequency (e.g., 10 Hz) as induced voltages drop linearly with frequency.

General error coefficients, such as ABCD error coefficients, for example, are determined in block S321 using a standard one-port impedance calibration procedure and the now fully known calibration standards, including the second short calibration standard and the at least two now fully known shunt calibration standards. In block S322, DUT impedance is measured for a DUT connected to the force and sense wiring 270 at the calibration plane in place of the last measured shunt calibration standard. The calibrated DUT impedance is then determined in block S323 using the general error coefficients and raw data from the measured DUT impedance, as well as a correction function.

The correction function is part of any known, standard one-port calibration for calculating general error coefficients of a generic one-port error model. The standard one-port calibration may be based on linear network modelling, which may include network parameters, such as ABCD chain parameters, S-parameters and/or Z-parameters, for example, which are used to describe a general error model as outlined in FIG. 5. That is, FIG. 5 is a simplified block diagram showing a standard one-port calibration.

Figure 5:
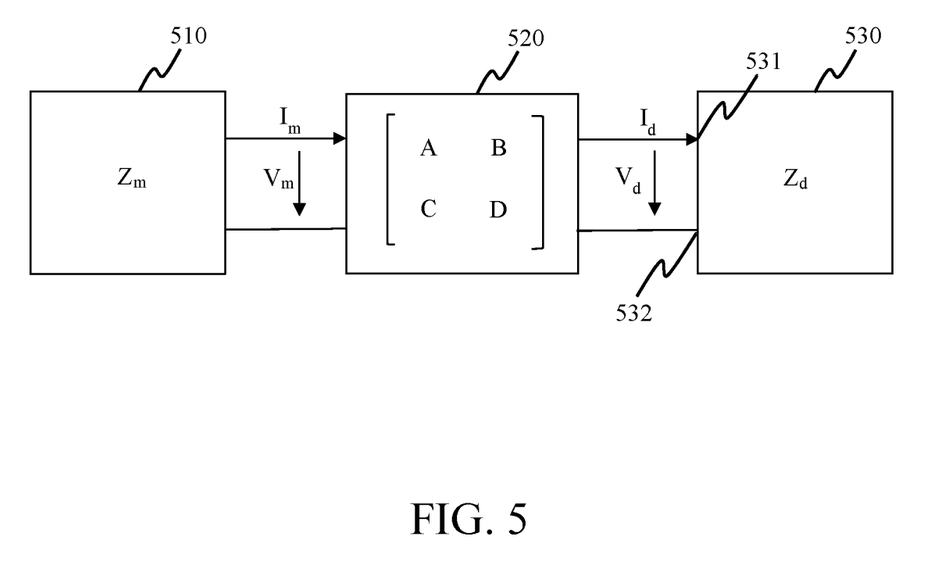
FIG. 5 is a simplified block showing a standard one-port calibration of a test instrument.

Referring to FIG. 5, an ideal impedance measurement device 510 is connected through an error box 520 to DUT 530. The error box 520 accounts for all systematic errors, and the ideal impedance measurement device 510 in combination with the error box 520 represents a real (i.e., a non-ideal) impedance measurement device. The DUT 530 has a true impedance $Z_d$, which may be described by $Z_d = V_d/I_d$, where $V_d$ is DUT voltage across DUT terminals 531 and 532 and $I_d$ is DUT current through the DUT 530. More particularly, $V_d$ is the voltage across the DUT sense connectors and $I_d$ is the current through the DUT force connectors. The voltage across the DUT force connectors and the current through the DUT sense connectors are not taken into account which, does not introduce additional errors due to the nature of low impedance measurements. The error box 520 represents a general transform between the true impedance $Z_d$ and the measured impedance $Z_m$. The measured impedance $Z_m$ is the reading provided by the ideal impedance measurement device 510 described by $Z_m = V_m/I_m$, where $V_m$ is the measured voltage and $I_m$ is the measured current. Thus, the general transform represented by the error box 520 may be given, for example, by Equations (1) and (2), where A, B, C and D are elements in a matrix of the error box 520:

$$V_m = A*V_d + B*I_d \quad (1)$$

$$I_m = C*V_d + D*I_d \quad (2)$$

Expressed in terms of measured impedance, Equations (1) and (2) are provided by Equation (3):

$$Z_m = (A*Z_d + B)/(C*Z_d + D) \quad (3)$$

Error coefficients k1, k2 and k3 are substituted into Equation (3), where k1=C/D, k2=A/D, and k3=B/D, indicated by calibration Equation (4):

$$k1*Z_m*Z_d + Z_m = k2*Z_d + k3 \quad (4)$$

In order to solve for the error coefficients k1, k2 and k3 in Equation (4), Equation system (5) needs to be solved:

$$Zm1*Zd1 - Zd1 - 1k1 - Zm1$$

$$A*x = b \text{ with } A = Zm2*Zd2 - Zd2 - 1, x = k2 \text{ and } b = -Zm2.$$

$$Zm3*Zd3 - Zd3 - 1k3 - Zm3 \quad (5)$$

The Equation system (5) is exactly solvable with three independent equations corresponding to three calibration standards, such as the short calibration standard and two shunt calibration standards discussed above, for example. However, as mentioned above, additional equations corresponding to additional calibration standards (e.g., additional shunt standards) may be added, in which case the Equation system (5) is overdetermined and needs to be solved differently, for example, by the least squared error method.

A correction Equation (6) is derived from the calibration Equation (4), and enables calculation of the true impedance $Z_d$ from the measured impedance $Z_m$ once the error coefficients k1, k2 and k3 have been determined by the Equation system (5):

$$Z_d = (Z_m - k3)/(k2 - k1*Z_m) \quad (6)$$

Figure 4A:
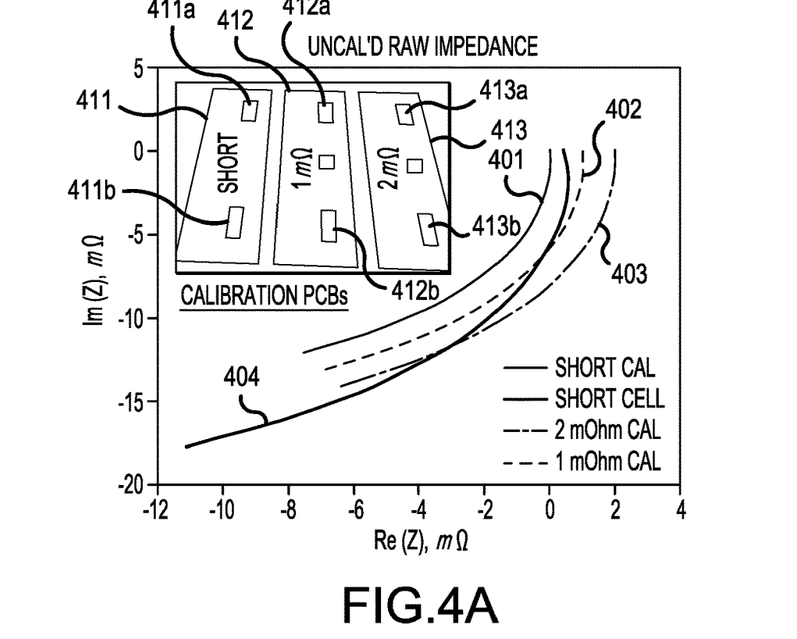
FIG. 4A includes graphs illustrating examples of impedances of calibration standards and calibrated impedance of a DUT, determined according to a representative embodiment.
Figure 4B:
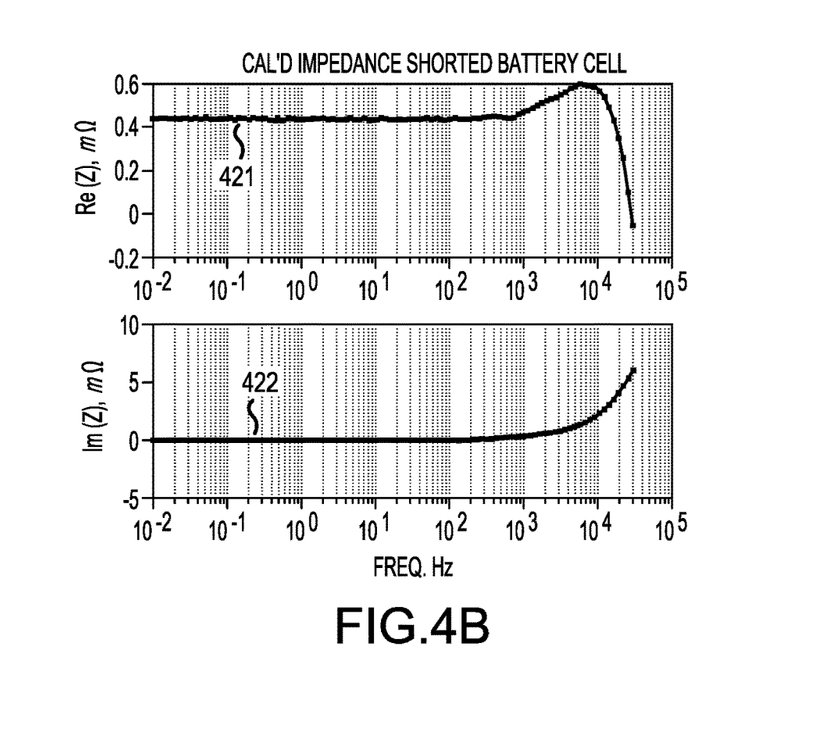
FIG. 4B includes graphs illustrating examples of calibrated impedance of a DUT as a function of frequency, determined according to a representative embodiment.

FIGS. 4A and 4B are graphs illustrating an example of determining calibrated impedance of a DUT, according to a representative embodiment. That is, FIG. 4A includes graphs illustrating examples of raw data impedances of calibration standards and craw data impedance of a DUT, and FIG. 4B includes graphs illustrating examples of calibrated impedance of the DUT as a function of frequency, determined according to a representative embodiment.

FIG. 4A includes a graph plotting a real part (Re(Z)) and an imaginary part (Im(Z)) of impedances for three calibration standards and for the DUT, which in the example is a prismatic battery enclosure with an internal short bar. The DUT is assumed to have a low impedance (e.g., less than about 500µΩ, in this example) that is difficult to measure using conventional techniques. The three calibration standards may include a short calibration standard 411 (0Ω), a first shunt calibration standard 412 (1 mΩ) and a second shunt calibration standard 413 (2 mΩ), also depicted in FIG. 4A. Each of the first and second shunt calibration standards 412 and 413 is partly known, in that only the real part (resistance) is provided, as discussed above. The short calibration standard 411 includes terminals 411a and 411b for connecting to the impedance measurement device (e.g., impedance measurement device 100) at an offset nulling plane and a calibration plane of a corresponding specific error model (e.g., specific error model 200). The first shunt calibration standard 412 includes terminals 412a and 412b and the second shunt calibration standard 413 includes terminals 413a and 413b for connecting to the impedance measurement device at a calibration plane of the corresponding specific error model. A distance between the terminals 411a and 411b must equal the distance between terminals of the DUT. A distance between the terminals 412a and 412b, and a distance between the terminals 413a and 413b, may be the same as or different from one another, and the same as or different from the distance between terminals of the DUT. In the depicted embodiment, for purposes of illustration, the distance between the terminals 411a and 411b, the distance between the terminals 412a and 412b, and the distance between the terminals 413a and 413b are equal to one another, and are also equal to a distance between terminals of the DUT itself (not shown). This assures, in part, that the short calibration standard 411 and the first and second shunt calibration standards 412 and 413 have the same geometry of the DUT.

Raw data measured with each of the short calibration standard 411, the first shunt calibration standard 412, and the second shunt calibration standard 413 connected in place are plotted in the complex plane (e.g., Nyquist plot) to provide respective traces 401, 402 and 403 in FIG. 4A. The imaginary parts of the first and second shunt calibration standards 412 and 413, in particular, are determined in accordance with the process discussed above with reference to FIG. 3, for example. Trace 404 depicts the complex raw data impedance measurement of the DUT.

FIG. 4B includes two graphs showing the calibrated complex impedance measurements of the DUT as a function of frequency of the excitation signal, where the impedance measurement device has been calibrated according to an embodiment of the disclosure using the short calibration standard 411, and the partly known first and second shunt calibration standards 412 and 413. The top graph shows trace 421 plotting a real part (Re(Z)) of the calibrated DUT impedance as a function of frequency, and the bottom graph shows trace 422 plotting an imaginary part (Im(Z)) of the calibrated DUT impedance as a function of frequency. In the depicted example, the DUT is measured in a frequency range of about 10 mHz to about 30 kHz, for example.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of calibrating an impedance measurement device for measuring low level impedance of a device under test (DUT), the method comprising:
performing short calibration measurements of the impedance measurement device over a predetermined frequency range using a short calibration standard with force and sense wiring connections to obtain short raw data;
performing first shunt calibration measurements of the impedance measurement device over the predetermined frequency range using a first shunt calibration standard to obtain first raw data, the first shunt calibration standard having a known first resistance value and an unknown first inductance value;
performing second shunt calibration measurements of the impedance measurement device over the predetermined frequency range using a second shunt calibration standard to obtain second raw data, the second shunt calibration standard having a known second resistance value and an unknown second inductance value;
determining first and second complex impedances of the first and second shunt calibration standards, respectively, by calculating the first and second inductance values using the short raw data and the first and second raw data applied to a specific error model representing systematic error terms of the impedance measurement device; and
determining general error coefficients for an error model of the impedance measurement device using the first and second complex impedances, the short raw data, and the first and second raw data applied to a standard one-port calibration procedure.

2. The method of claim 1, wherein determining the first and second complex impedances of the first and second shunt calibration standards comprises:
determining model error coefficients according to the specific error model using the first and second raw data; and
calculating the first and second inductance values using the model error coefficients and the first and second raw data.

3. The method of claim 1, wherein each of the first shunt calibration standard and the second shunt calibration standard has a low level impedance between about 1 microOhm and about 100 Ohms.

4. The method of claim 2, wherein the model error coefficients include offset impedance, a complex scaling value, and mutual inductance corresponding to the impedance measurement device.

5. The method of claim 4, further comprising:
initially performing initial short calibration measurements of the impedance measurement device using an initial short calibration standard without the force and sense wiring connections to obtain initial short raw data; and
calculating the offset impedance using the initial short calibration measurements.

6. The method of claim 5, further comprising:
initially performing the initial short calibration measurements at using the initial short calibration standard with the force and sense wiring connections, with the initial short calibration standard having different properties compared to the short calibration standard, the different properties comprising at least one of a different current path length or a different magnetic coupling between force and sense wiring.

7. The method of claim 1, further comprising:
connecting the DUT to the impedance measurement device by the force and sense wiring connections;
measuring impedance of the DUT over at least a portion of the predetermined frequency range; and
determining calibrated complex impedance of the DUT using the measured impedance and the determined general error coefficients.

8. The method of claim 1, wherein the first raw data comprises measured first impedance disturbed by systematic error, and the second raw data comprises measured second impedance disturbed by systematic error.

9. The method of claim 1, wherein the standard one-port calibration procedure is based on a linear network model.

10. The method of claim 9, wherein linear network model comprises linear network parameters, including ABCD parameters, S-parameters and/or Z-parameters.

11. The method of claim 1, wherein the error model comprises a one-port error model using one of a four-wire connection method, a two-wire connection method, an I-V method or an auto-nulling bridge method.

12. A method of calibrating an impedance measurement device for measuring low level impedance of a device under test (DUT) at low and high frequencies, the method comprising:
determining offset impedance ($Z_{os}$) of the impedance measurement device using a first short calibration standard at an offset nulling plane of specific error model corresponding to the impedance measurement device in response to a test signal sweep over a first predetermined frequency range;
determining a phase angle of a complex scaling value ($k_s$) of a specific error model using a second short calibration standard at a calibration plane of the specific error model in response to a test signal sweep over a second predetermined frequency range, the calibration plane coinciding with connections configured for connecting to the DUT;
measuring first impedance as first raw data using a first shunt calibration standard at the calibration plane in response to a test signal sweep over the second predetermined frequency range, the first shunt calibration standard having a known first real part and an unknown first imaginary part;
measuring impedance as second raw data using a second shunt calibration standard at the calibration plane in response to a test signal sweep over the second predetermined frequency range, the second shunt calibration standard having a known second real part and an unknown second imaginary part;

determining amplitude of the complex scaling value (ks) using the first and second known real parts and the first and second raw data;

determining mutual inductance from magnetic coupling in the connections configured for connecting to the DUT using the first and second known real parts and the first and second raw data;

determining a first imaginary part versus frequency function (IM(Z(freq))) describing the first imaginary part of the first shunt calibration standard and determining a second imaginary part versus frequency function describing the second imaginary part of the second shunt calibration standard based on the offset impedance (Zos), the complex scaling value (ks), and the mutual inductance (M), wherein a first complex impedance of the first shunt calibration standard comprises the known first real part and the described first imaginary part, and a second complex impedance of the second shunt calibration standard comprises the known second real part and the described second imaginary part; and determining general error coefficients for a general error model of the impedance measurement device using the first and second complex impedances and the first and second raw data.

13. The method of claim 12, wherein the general error model comprises a standard one-port calibration procedure.

14. The method of claim 12, further comprising:
connecting the DUT to the impedance measurement device at the calibration plane of the specific error model;
performing impedance measurements of the DUT over at least a portion of the first and second predetermined frequency ranges; and
determining calibrated complex impedance of the DUT using the impedance measurements and the determined general error coefficients of the general error model.

15. The method of claim 14, wherein a geometry of each of the first shunt calibration standard and the second shunt calibration standard matches a geometry of the DUT.

16. A method of calibrating an impedance measurement device for measuring low level impedance of a device under test (DUT), the method comprising:

initially performing an initial short calibration measurements using an initial short calibration standard with force and sense wiring connections;

performing short calibration measurements of the impedance measurement device over a predetermined frequency range using a short calibration standard with the force and sense wiring connections to obtain short raw data, wherein the initial short calibration standard has different properties, compared to the short calibration standard, comprising at least one of a different current path length or a different magnetic coupling between the force and sense wiring;

performing first shunt calibration measurements of the impedance measurement device over the predetermined frequency range using a first shunt calibration standard to obtain first raw data, the first shunt calibration standard having a known first resistance value and an unknown first inductance value;

performing second shunt calibration measurements of the impedance measurement device over the predetermined frequency range using a second shunt calibration standard to obtain second raw data, the second shunt calibration standard having a known second resistance value and an unknown second inductance value;

determining first and second complex impedances of the first and second shunt calibration standards, respectively, by calculating the first and second inductance values using the short raw data and the first and second raw data applied to a specific error model representing systematic error terms of the impedance measurement device;

determining general error coefficients for an error model of the impedance measurement device using the first and second complex impedances, the short raw data, and the first and second raw data applied to a standard one-port calibration procedure; and determining a frequency dependent real part of first shunt calibration standard by comparing the frequency dependent real part against a known frequency dependent function derived by the initial short calibration measurements and the short calibration measurements.

17. The method of claim 16, further comprising:
measuring resistance of one of the first and second shunt calibration standards by a direct current (DC) signal or a signal having a low frequency in a range of about 1 mHz to about 1 kHz.

* * * * *